United States Patent
Iguchi et al.

(10) Patent No.: US 6,780,700 B2
(45) Date of Patent: Aug. 24, 2004

(54) METHOD OF FABRICATING DEEP SUB-MICRON CMOS SOURCE/DRAIN WITH MDD AND SELECTIVE CVD SILICIDE

(75) Inventors: Katsuji Iguchi, Nara (JP); Sheng Teng Hsu, Camas, WA (US); Yoshi Ono, Camas, WA (US); Jer-shen Maa, Vancouver, WA (US)

(73) Assignee: Sharp Laboratories of America, Inc., Camas, WA (US)

( * ) Notice: Subject to any disclaimer, the term of this patent is extended or adjusted under 35 U.S.C. 154(b) by 70 days.

(21) Appl. No.: 10/035,503

(22) Filed: Oct. 25, 2001

(65) Prior Publication Data

US 2002/0106850 A1 Aug. 8, 2002

Related U.S. Application Data

(63) Continuation-in-part of application No. 09/649,382, filed on Aug. 28, 2000, now abandoned.

(51) Int. Cl.[7] .................. H01L 21/8238; H01L 21/337; H01L 21/338
(52) U.S. Cl. .................. 438/218; 438/220; 438/299
(58) Field of Search .................. 438/181, 188, 438/218, 220, 299

(56) References Cited

U.S. PATENT DOCUMENTS 4,703,551 A * 11/1987 Szluk et al. ................ 438/220
5,757,045 A * 5/1998 Tsai et al. ................ 257/336
6,069,044 A * 5/2000 Wu ............................ 438/299

OTHER PUBLICATIONS

Article entitled, "Selectivity to Silicon Nitride in Chemical Vapor Deposition of Titanium Silicide", by Maa et al., published in J. Vac. Sci. Technol. B 17(5), Sep./Oct. 1999, pp 2243–2247.
Article entitled, "Effects on Selective CVD of TITanium Disilicide by Substrate Doping and Selective Silicon Deposition", by Maa et al., published in Mat. Res. Soc. Symp. Proc. vol. 564, pp. 85–89.
Article entitled, "Prevention of Corner Voiding in Selective CVD Deposition of Titanium Silicide on SOI Device", by Maa et al., published in Mat. Res. Soc. Symp. Proc. vol. 564, pp 29–34.
Article entitled, "Selective Deposition of $T_iSi_2$ on Ultra–Thin Silicon–On–Insulator (SOI) Wafers", by Maa et al., published in Thin Solid Films 332(1998) pp. 412–417.

* cited by examiner

Primary Examiner—Alexander Ghyka
(74) Attorney, Agent, or Firm—David C. Ripma; Matthew D. Rabdau

(57) ABSTRACT

A method of forming a MOS or CMOS device on a silicon substrate, includes preparing a substrate to contain conductive regions having device active areas therein; forming a gate electrode on the active areas; depositing and forming a gate electrode sidewall insulator layer on each gate electrode; implanting ions of a first type to form a source region and a drain region in one active area and implanting ions of a second type to form a source region and a drain region in the other active area.

11 Claims, 4 Drawing Sheets

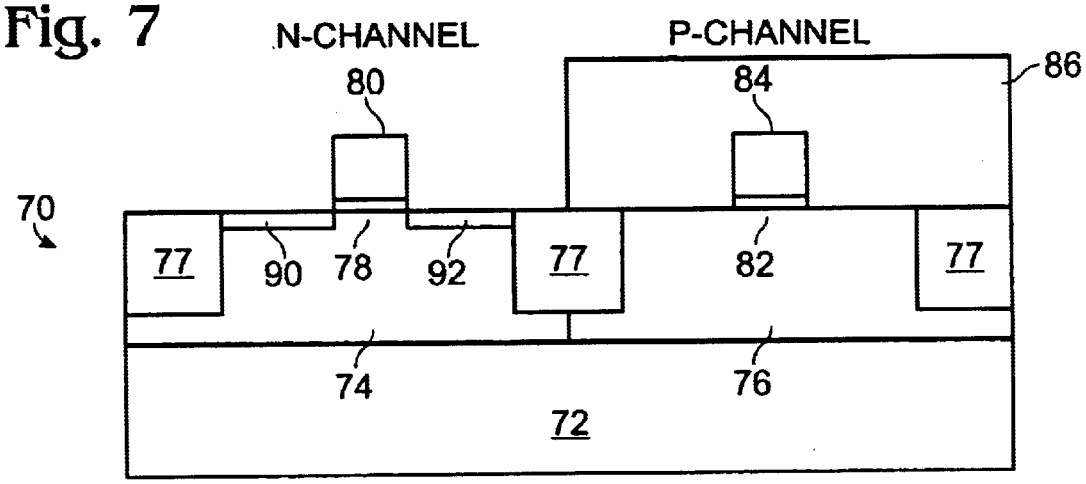
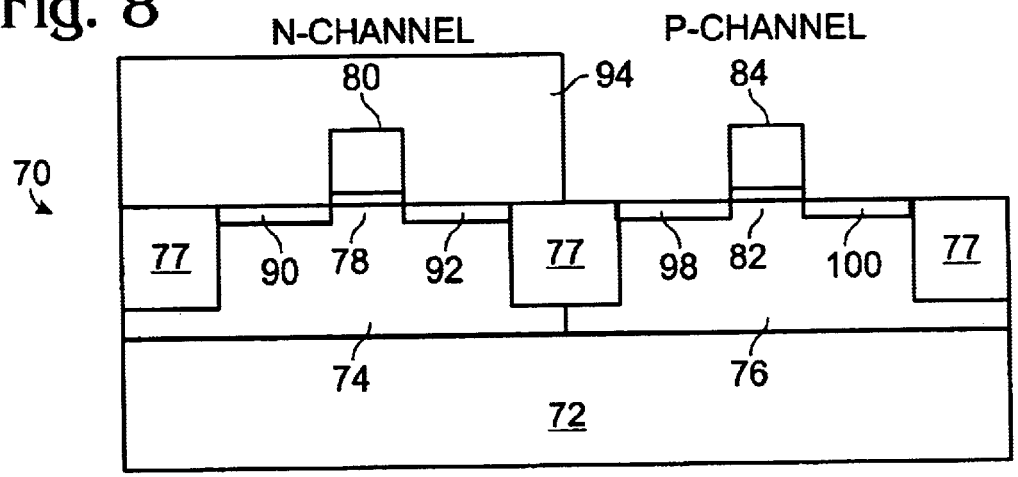
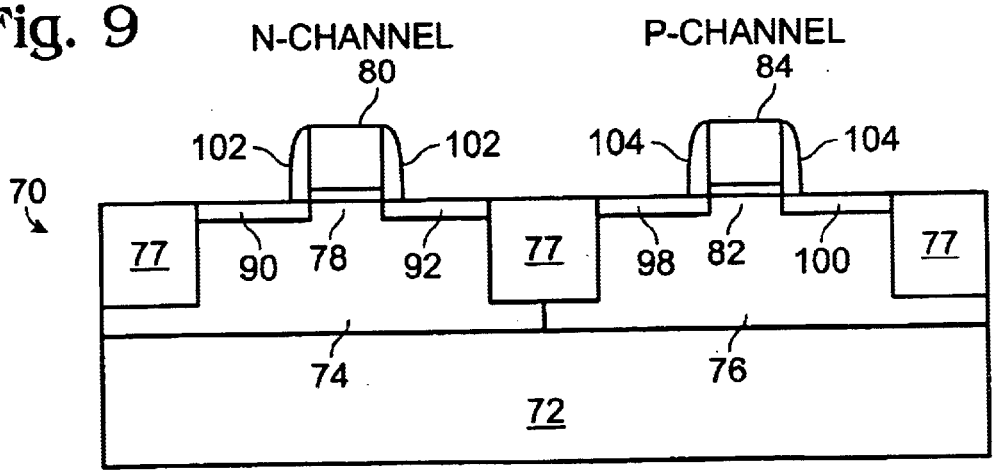

US 6,780,700 B2

METHOD OF FABRICATING DEEP SUB-MICRON CMOS SOURCE/DRAIN WITH MDD AND SELECTIVE CVD SILICIDE

CROSS REFERENCE TO RELATED APPLICATIONS

This application is a continuation-in-part of application Ser. No. 09/649,382, filed Aug. 28, 2000 now abandoned, entitled "Method of Fabricating Deep Sub-Micron CMOS Source/Drain with MDD and Selective CVD Silicide," invented by Iguchi et al.

FIELD OF THE INVENTION

This invention relates to metal-oxide-semiconductor (MOS) and complimentary metal-oxide-semiconductor (CMOS) integrated circuit (IC) fabrication processes, and specifically to a new process requiring fewer steps than conventional sub-micron MOS and CMOS fabrication processes.

BACKGROUND OF THE INVENTION

Known state-of-the-art processes for fabricating source/drain regions of active devices in integrated circuits including MOS and CMOS transistors require implantation of low dose ions, which is known as LDD implantation, followed by the formation of a gate sidewall insulator and n+ and p+ ion implantation. After n+ and p+ ion implantation, a salicide process generally is required to reduce any parasitic resistance in the source/drain region of the device. This requires, using conventional fabrication techniques, four separate masks operations: two masks are required for LDD ion implantation, a third mask is required for n+ ion implantation and a fourth mask is required for p+ ion implantation. An example of a salicide process is the deposition of a refractory metal, followed by a rapid thermal annealing (RTA) process to form a mono-silicide. After RTA, the un-reacted metal is etched away, followed by another RTA step to form a low resistance di-silicide.

It would be advantageous to have a method of fabricating MOS devices and CMOS devices in which the number of mask levels and ion implantation steps are reduced.

It would also be advantageous to have such a method in which a silicide layer is provided using only a single selective CVD silicide deposition.

SUMMARY OF THE INVENTION

The invention provides a method of forming a MOS device on a silicon substrate. Steps in one illustrative embodiment of the invention comprise preparing a substrate to contain a conductive region of a first conductivity type having a first device active area; forming a gate electrode structure on the first device active area, the gate electrode structure including a gate electrode and insulating sidewalls; implanting ions of an opposite conductivity type from that of said first device active area into the exposed portions of said conductive region to form source and drain regions on opposite sides of said gate structure; and depositing by selective CVD a silicide layer over said source and drain regions.

The preferred method of the invention further includes, in the implanting step, implanting ions using plasma immersion ion implantation at an energy in a range of about 0.5 keV to 2 keV, a dose in a range of about $1.0 \times 10^{14}$ cm$^{-2}$ to $1.0 \times 10^{15}$ cm$^{-2}$, to yield a surface ion concentration in the source and drain regions in a range of about $1.0 \times 10^{19}$ cm$^{-3}$ to $1.0 \times 10^{22}$ cm$^{-3}$.

An alternative perferred embodiment of the invention provides for carrying out the implanting step, using low energy ion implantation, before the formation of the gate sidewalls. When low energy ion implantation is used, ion implantation is carried out at an energy in a range of about 0.5 keV to 10 keV, a dose in a range of about $1.0 \times 10^{14}$ cm$^{-2}$ to $1.0 \times 10^{15}$ cm$^{-2}$, to yield a surface ion concentration in the source and drain regions in a range of about $1.0 \times 10^{19}$ cm$^{-3}$ to $1.0 \times 10^{22}$ cm$^{-3}$.

In another alternative embodiment of the invention, a method of forming a CMOS device on a silicon substrate is provided. In this embodiment the substrate is prepared to contain a conductive region of a first type having a first device active area therein; and to contain a conductive region of a second type having a second device active area therein. Steps further include forming a gate electrode on the first and second active areas; depositing and forming a gate electrode sidewall insulator layer on each gate electrode; masking the conductive region of the first type; implanting ions of a first type into the exposed portions of the conductive region of the second type to form a source region and a drain; stripping the mask; masking the conductive region of the second type; implanting ions of a second type into the exposed portions of the conductive region of the first type to form a source region and a drain region; stripping the mask; and depositing, preferably by selective CVD, a silicide layer over the source/drain regions of the first and second device active areas.

Additional steps in the alternative embodiment include implanting ions to form the source/drain regions using plasma immersion ion implantation as described above.

In a further embodiment of the present invention, CMOS devices are formed by the above-described steps except that the ion implantation is carried out before the gate sidewalls are formed using low energy ion implantation, and the gate sidewalls are formed after the ion implantation steps.

BRIEF DESCRIPTION OF THE DRAWINGS

FIGS. 7–11 depict steps of the method of the invention for low energy ion implantation.

DETAILED DESCRIPTION OF THE PREFERRED EMBODIMENT

The method of the invention will first be described for formation of CMOS devices on a substrate. The invention provides a technique for the fabrication of CMOS devices wherein at least two of the masking and photoresist stripping steps used in conventional CMOS fabrication are eliminated. Additionally, a salicide layer is deposited in a single chemical vapor deposition (CVD) process step, thereby reducing time and cost in the fabrication process. One embodiment of the invention uses plasma immersion ion implantation, which is generally effective to form the desired CMOS, and is the preferred embodiment. Low energy ion implantation may also be used and is provided for in an alternative embodiment of the invention.

"Sub-micron" means that the gate electrode used in the structure of the invention is less than 1000 nm in width. It will be appreciated that any suitable integrated circuit interconnect material, which includes all refractory metals, the most common of which is aluminum, may be used. In the examples provided herein, a p-well is formed in an n-type substrate, although the structure and fabrication process may also be used to provide a n-well formed in a p-type substrate to form a complimentary metal-oxide semiconductor (CMOS) device.

Plasma Immersion Ion Implantation

Figure 1:
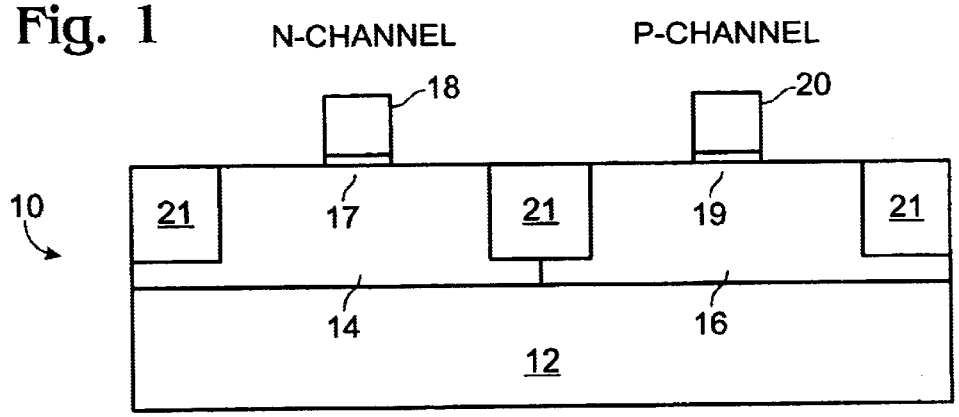
FIGS. 1–6 depict steps of the method of the invention for plasma immersion ion implantation.

Referring now to FIG. 1, a structure 10 includes a substrate 12, which may be single-crystal silicon, and, in the preferred embodiment, is a n-type substrate. State-of-the-art processes are performed to form a p-well 14, a first device active area, in an n-channel region, also referred to herein as a conductive region of a first type. An n-well 16 is provided in substrate 12, which functions as a second device active area, in a p-channel region, also referred to herein as a conductive region of a second type. The terms "first type" and "second type" are alternatively referred to herein as "first conductivity type" and "second conductivity type," respectively, and refer, respectively, to n-type or p-type semiconductor material wherein the first conductivity type is the opposite of the second. Proper device isolation and threshold voltage adjustments are made to the substrate, resulting in isolation regions 21, followed by gate oxidation, and gate electrode formation, resulting in a p-well gate electrode 18 over a gate region 17, and an n-well gate electrode 20 over a gate region 19.

Figure 2:
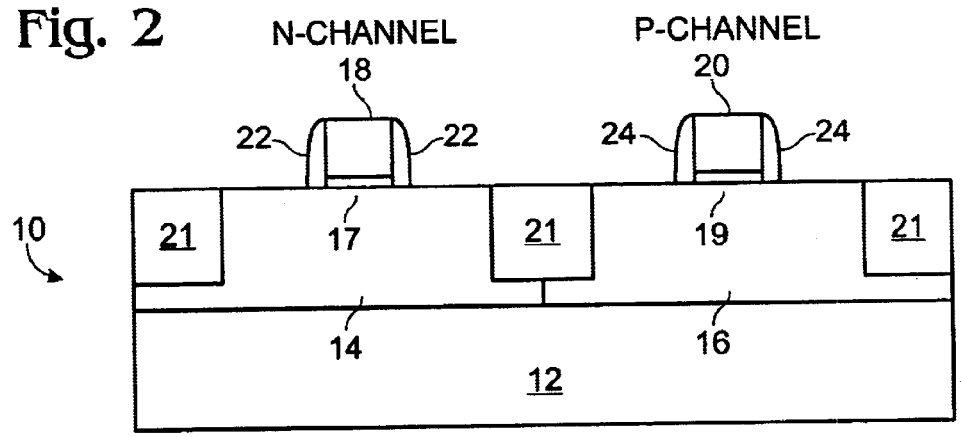

A thin layer of insulator, such as silicon oxide or silicon nitride, is deposited by CVD, and formed by plasma anisotropic etching, to form gate electrode sidewall insulator layers 22, 24 on gate electrodes 18, 20, respectively, as shown in FIG. 2.

Figure 3:
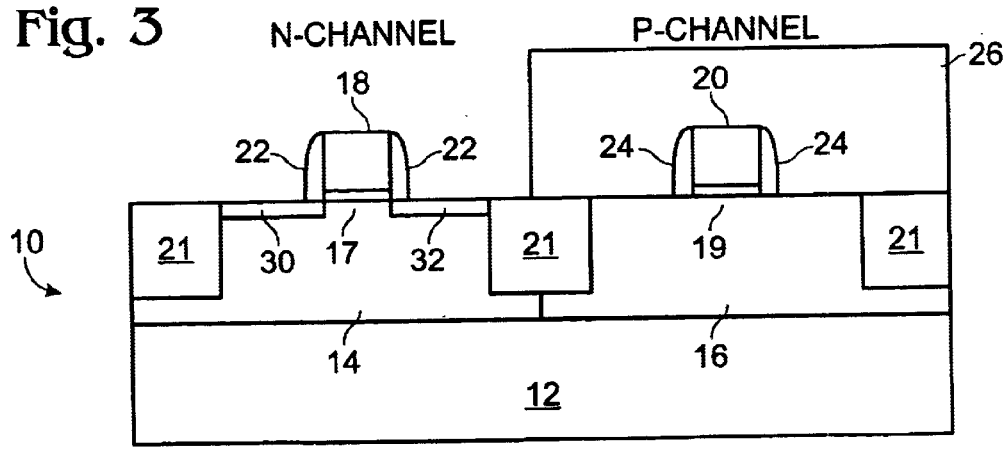

Referring now to FIG. 3, a layer of photoresist 26 is formed over the p-channel region, which in the embodiment show is the second device active area. Plasma immersion ion implantation is performed to implant ions of the n-type, which in this embodiment will be referred to as ions of a second type, into the exposed portions of the first device active area 14. Arsenic or phosphorus ions are implanted by plasma immersion ion implantation at an implant energy in a range of about 0.5 keV to 2 keV, to dope the surface of p-well 14. The preferred dose of implanted ions is generally in the range of about $1.0 \times 10^{14}$ cm$^{-2}$ to $1.0 \times 10^{15}$ cm$^{-2}$. The result is the formation of a n+ source region 30 and an n+ drain region 32. The surface concentration of ions in the n+ source/drain region is between $1 \times 10^{19}$ to $1 \times 10^{22}$ cm$^{-3}$. The process for forming the source/drain regions in this and the other embodiments of the invention described herein results in a medium (or moderately) doped drain (MDD) device. Mask 26 is then stripped.

Figure 4:
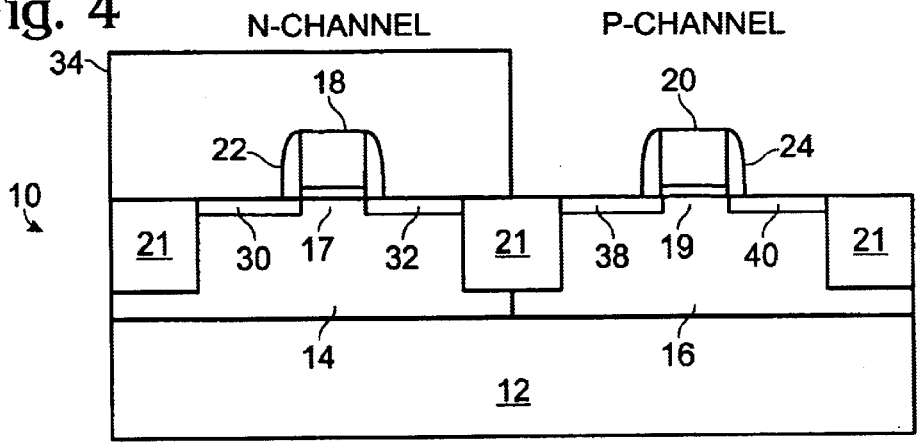

Next, and now referring to FIG. 4, a photoresist mask 34 is deposited over the n-channel region, which is the first device active area 14. Plasma immersion ion implantation is performed to implant ions of the p-type, into the exposed portions of the second device active area 16. Boron or $BF_2$ ions are implanted using plasma immersion ion implantation, again at an implant energy in a range of about 0.5 keV to 2 keV, to dope the surface of the p-channel region 16. The preferred dose of implanted ions is generally in the range of about $1.0 \times 10^{14}$ cm$^{-2}$ to $1.0 \times 10^{15}$ cm$^{-2}$. The result is the formation of a p+ drain region 38 and a p+ source region 40. The surface ion concentration of the p+ source/drain region is generally in the range of $1 \times 10^{19}$ to $1 \times 10^{22}$ cm$^{-3}$. Mask 34 is stripped.

Figure 5:
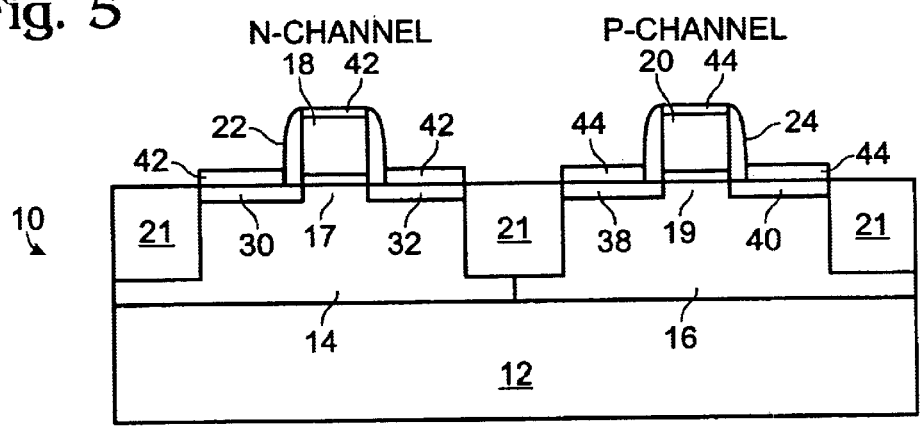

Turning to FIG. 5, silicide layers are deposited over the source and drain regions, resulting in silicide layers 42 in the n-channel region and silicide layers 44 in the p-channel region. The silicide is deposited by selective CVD of silicide only onto the conductive areas of the substrate, including the source, gate electrode, and drain regions. Selective CVD of silicide does not deposit silicide on insulating surfaces such as the isolation regions 21 and gate sidewalls 22, 24. Selective CVD of silicide is a prior art process known to those skilled in the art of IC fabrication. See for example, Maa et al., "Selective Deposition of TiSi$_2$ On Ultra-Thin Silicon-on-Insulator (SOI) Wafers," Thin Solid Films, Vol. 332, pp. 412–417, 1998; Maa, et al., "Effects on Selective CVD of Titanium Disilicide by Substrate Doping and Selective Silicon Deposition," Mat. Res. Soc. Symp. Proc., Vol. 564, pp. 85–89, 1999; Maa et al., "Prevention of Corner Voiding in Selective CVD Deposition of Titanium Silicide on SOI Device," Mat. Res. Soc. Symp. Proc., Vol. 564, pp. 29–34, 1999; and Maa et al., "Selectivity to Silicon Nitride in Chemical Vapor Deposition of Titanium Silicide," J. Vac. Sci. Technology B 17(5), September/October 1999, pp. 2243–47.

The structure is activated by annealing, either before or after the selective CVD deposition step. A suggested anneal for use with this and the other embodiments of the present invention described herein is at a temperature generally in the range of 600° C. to 1000° C. for between approximately 10 seconds and 30 minutes.

Figure 6:
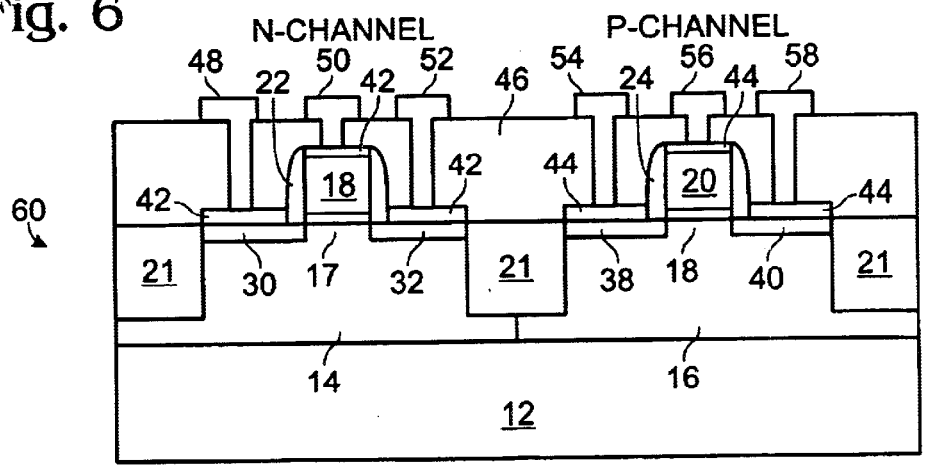

As shown in FIG. 6, a layer of oxide 46 is deposited by CVD, followed by metallization. Electrode 48 is connected to what is now nMOST source 30, electrode 50 to nMOST gate 18, electrode 52 to nMOST drain 32, electrode 54 to pMOST drain 38, electrode 56 to pMOST gate 20 and electrode 58 to pMOST source 40.

The low energy plasma immersion ion implantation may cause a significant lateral penetration of ions through the insulator sidewall spacer at the gate electrode. Therefore, a proper sidewall insulator thickness and a proper gate-to-source/drain overlap is obtained by using well-known techniques for selecting the sidewall thickness. See, for example, N. W. Cheung, "Plasma Immersion Ion Implantation for Semiconductor Processing," Materials Chemistry and Physics, Vol. 46, (1996), p.132–139.

It will be readily appreciated by those skilled in the art that the order in which the first and second device active areas 14, 16 are masked and implanted is arbitrary and may be reversed. For example, the method may alternatively be carried out by first masking the first device active area 14, as shown in FIG. 4, implanting ions of a first type into the second device active area 16, stripping the mask, and then masking the second device active area 16, as shown in FIG. 3, and implanting ions of a second type into the first device active area 14. The other steps of the method will be unchanged.

Low Energy Ion Implantation

The lateral penetration of doping ions is very small using traditional low energy ion implantation. The process sequence of the preferred embodiment are modified to form the sidewall insulator after the source and drain regions have been formed, as shown and described with reference to FIGS. 7–11.

Turning now to FIG. 7, a structure 70 includes a substrate 72, which may be single-crystal silicon. State-of-the-art processes are performed to form a p-well 74, in an n-channel region of structure 70; an n-well 76 in a p-channel region of structure 70. Proper device isolation, resulting in the formation of isolation regions 77, and threshold voltage adjustments are made, followed by gate oxidation, and gate electrode formation, resulting in a p-well gate region 78 having a p-well gate electrode 80 thereover, and an n-well gate region 82 having an n-well gate electrode 84 thereover. Sidewalls are not formed adjacent gate electrodes 80, 84 at this time.

As shown in FIG. 7, a layer of photoresist 86 is formed over the n-channel region, also called the first device active area 74, and over the p-channel region, also called the second device active area 76. Portions of the photoresist over the n-channel are etched to expose the surface of the first device active area, p-well 74. Low energy ion implantation of phosphorus or arsenic ion is performed in a range of about 0.5 keV to 10 keV, to dope the surface of p-well 74. The preferred dose of implanted ions is generally in the range of about $1.0 \times 10^{14}$ cm$^{-2}$ to $1.0 \times 10^{15}$ cm$^{-2}$. The result is the formation of a n+ source region 90 and an n+ drain region 92. The surface concentration of ions in the n+ source/drain regions is between $1 \times 10^{19}$ cm$^{-3}$ to $1 \times 10^{22}$ cm$^{-3}$. Mask 86 is then stripped.

Now referring to FIG. 8, a photoresist mask 94 is deposited over the n-channel region 74, also called the first device active area. Low energy ion implantation of boron or BF$_2$ ions is performed, again in a range of about 0.5 keV to 10 keV, to dope the surface of the second device active area 76. The preferred dose of implanted ions is generally in the range of about $1.0 \times 10^{14}$ cm$^{-2}$ to $1.0 \times 10^{15}$ cm$^{-2}$. The result is the formation of a p+ drain region 98 and a p+ source region 100. The surface ion concentration of the p+ source/drain regions is generally in the range of $1 \times 10^{19}$ cm$^{-3}$ to $1 \times 10^{22}$ cm$^{-3}$. Mask 94 is then stripped.

As shown in FIG. 9, a thin layer of insulator, such as silicon oxide or silicon nitride, is deposited by CVD, and plasma anisotropic etched to form sidewall insulators 102 and 104 about gate electrodes 80 and 84, respectively.

Figure 10:
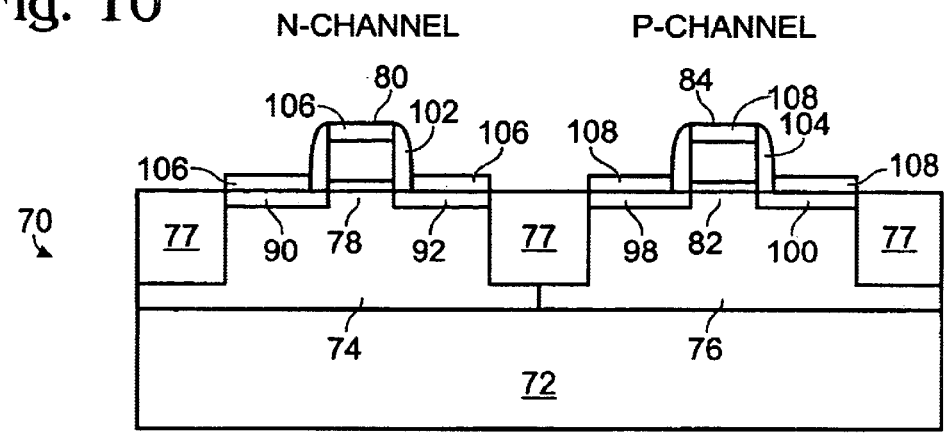

Turning to FIG. 10, following the formation of sidewalls 102, 104 silicide is selectively deposited by CVD, including over the source and drain regions, and the gate electrodes 80, 84 resulting in silicide layers 106 in the n-channel region and silicide layers 108 in the p-channel region. The preferred silicide film includes titanium silicide but is not limited to titanium silicide. The deposition can be carried out in a RTCVD reactor using gas mixture include TiCl$_4$, silane, dichlorosilane, and hydrogen. When other silicide film, such as cobalt silicide, nickel silicide is chosen, proper precursor will be used to replace TiCl$_4$.

Figure 11:
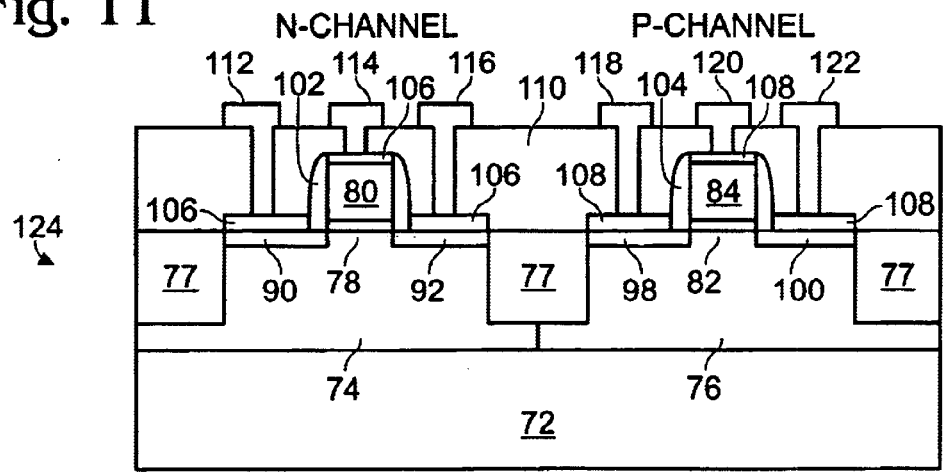

As shown in FIG. 11, a layer of oxide 110 is deposited by CVD, followed by passivation and metallization. Electrode 112 is connected to what is now CMOS 124 nMOST source 90, electrode 114 to nMOST gate 80, electrode 116 to nMOST drain 92, electrode 118 to pMOST drain 98, electrode 120 to PMOST gate 84, and electrode 122 to pMOST source 100.

A method of forming CMOS transistors has been described in accordance with the present invention. The present invention also is suitable for forming MOS devices wherein all devices formed have the same conductivity types in the substrate active device areas. In describing the formation of MOS transistors in accordance with the present invention, reference will be made to only the left half of FIGS. 1–11 wherein n-channel devices are formed. It will be readily understood that the invention is equally suitable for forming p-channel devices using the same method, but opposite conductivity type substrates and implanted ions.

Referring to the left half of FIGS. 1–6, a method is provided of forming a MOS device on a silicon substrate 12. The substrate is prepared having a first device active area 14, which in this description will be of p-type conductivity. A gate electrode structure is formed on the first device active area 14, the gate structure includes electrode 18 and insulating sidewalls 22. The substrate, gate, and sidewalls are formed as described above in the previous embodiments.

Referring now to FIG. 3, ions are implanted of an opposite conductivity type from that of the first device active area 14 into the exposed portions of the substrate to form source and drain regions on opposite sides of said gate structure. In this embodiment, n-type ions are implanted into p-well 14. Plasma immersion ion implantation is performed to implant ions of the n-type in this embodiment into the exposed portions of the first device active area 14. Arsenic or phosphorus ions are implanted by plasma immersion ion implantation at an implant energy in a range of about 0.5 keV to 2 keV, to dope the surface of p-well 14. The preferred dose of implanted ions is generally in the range of about $1.0 \times 10^{14}$ cm$^{-2}$ to $1.0 \times 10^{15}$ cm$^{-2}$. The result is the formation of a n+ source region 30 and an n+ drain region 32. The surface concentration of ions in the n+ source/drain region is between $1 \times 10^{19}$ to $1 \times 10^{22}$ cm$^{-3}$.

Turning to FIG. 5, silicide layers are deposited over the source and drain regions 30, 32, resulting in silicide layers 42 in the n-channel region. The silicide is deposited by CVD of silicide onto the conductive areas of the substrate, including the source, gate electrode, and drain regions.

Finally, as shown in FIG. 6, a layer of oxide 46 is deposited by CVD, followed by metallization. Electrode 48 is connected to what is now nMOST source 30, electrode 50 to nMOST gate 18, electrode 52 to nMOST drain 32.

Referring to the left half of FIGS. 7–11, a method is provided of forming a MOS device on a silicon substrate 72 using low energy ion implantation instead of plasma immersion ion implantation. Referring to FIG. 7, the substrate is prepared having a first device active area 74, which in this description will be of p-type conductivity. A gate electrode structure is formed on the first device active area 74, the gate structure includes electrode 80, but not insulating sidewalls. The substrate, gate, and sidewalls are formed as described above in the previous embodiments.

Referring now to FIG. 8, ions are implanted of an opposite conductivity type from that of the first device active area 74 into the exposed portions of the substrate to form source and drain regions on opposite sides of said gate structure. In this embodiment, n-type ions are implanted into p-well 74. Low energy ion implantation is performed to implant ions of the n-type in this embodiment into the exposed portions of the first device active area 74. Arsenic or phosphorus ions are implanted by low energy ion implantation at an implant energy in a range of about 0.5 keV to 10 keV, to dope the surface of p-well 74. The preferred dose of implanted ions is generally in the range of about $1.0 \times 10^{14}$ cm$^{-2}$ to $1.0 \times 10^{15}$ cm$^{-2}$. The result is the formation of a n+ source region 90 and an n+ drain region 92. The surface concentration of ions in the n+ source/drain region is between $1 \times 10^{19}$ to $1 \times 10^{22}$ cm$^{-3}$.

Then insulating sidewalls 102 are formed around gate electrode 80, as shown in the left half of FIG. 9.

A silicide layer is then deposited over the source and drain regions 90, 92, and over gate electrode 80, resulting in silicide layers 108, as shown in FIG. 10. The silicide is deposited by CVD of silicide onto the conductive areas of the substrate, including the source, gate electrode, and drain regions.

Finally, as shown in FIG. 11, a layer of oxide 110 is deposited by CVD, followed by metallization. Electrode 112 is connected to what is now nMOST source 90, electrode 114 to nMOST gate 80, and electrode 116 to nMOST drain 92.

The throughput of plasma immersion ion implantation is many times higher than that of the traditional ion implantation. Processing time increases proportionately with wafer area when using traditional ion implantation, whereas it is constant for plasma immersion ion implantation, so the advantage is magnified as substrate sizes increase. Therefore the plasma immersion ion implantation method is preferred over the traditional ion implantation method.

Thus, a method for fabricating deep sub-micron MOS and CMOS source/drain with MDD and selective CVD silicide has been disclosed. It will be appreciated that further variations and modifications thereof may be made within the scope of the invention as defined in the appended claims.

We claim:

1. A method of forming a MOS device on a silicon substrate, comprising:

preparing a substrate to contain a conductive region of a first conductivity type having a first device active area;

forming a gate electrode structure on the first device active area, said gate electrode structure including a gate electrode and insulating sidewalls;

implanting ions using a single mask and in a single implantation step of an opposite conductivity type from that of said first device active area into the exposed portions of said conductive region to form source and drain regions on opposite sides of said gate structures wherein the source region includes a LDD source region underlying the insulating sidewall, and wherein the drain region includes a LDD drain region underlying the insulating sidewall; and depositing by selective CVD a silicide layer over said source and drain regions and over said gate electrode.

2. The method of claim 1 in which said single implanting step includes implanting ions using plasma immersion ion implantation at an energy in a range of about 0.5 keV to 2 keV to form a shallow implant.

3. The method of claim 1 in which said implanting step includes implanting ions using plasma immersion ion implantation and includes implanting at a dose in a range of about $1.0 \times 10^{14}$ cm$^{-2}$ to form a MDD device.

4. The method of claim 1 in which said implanting stop includes implanting ions using plasma immersion ion implantation and includes implanting to yield a surface ion concentration in said source and drain regions in a range of about $1.0 \times 10^{19}$ cm$^{-3}$ to $1.0 \times 10^{22}$ cm$^{-3}$ to form a shallow implant, MDD device.

5. The method of claim 1 including, following said step of depositing a silicide layer by CVD, the steps of depositing an insulating layer over the structure and metallizing the structure.

6. A method of forming a CMOS device on a silicon substrate, comprising:

preparing a substrate to contain a conductive region of a first type having a first device active area therein, and to contain a conductive region of a second type having a second device active area therein;

forming gate electrodes on the first and on the second active areas;

depositing and forming a gate electrode sidewall insulator layer on each gate electrode;

masking the first device active area;

implanting ions using a single mask in a single implantation step of a first type into the exposed portions of the second device active area to form a source region and a drain region in the second device active area, wherein the second device source region includes a LDD source region underlying the insulating sidewall, and wherein the second device drain region includes a LDD drain reigon underlying the insulating sidewall; stripping the mask;

masking the second device active area;

implanting ions of a second type into the exposed portions of the first device active area to form a source region and a drain region in the first device active area, wherein the first device source region includes a LDD source region underling the insulating sidewall, and wherein the first device drain region includes a LDD drain region underlying sidewall; stripping mask; and depositing a silicide layer over the gate electrodes and the source and drain regions in the first and second device active areas.

7. The method of claim 6 wherein said implanting steps includes implanting ions using plasma immersion ion implantation.

8. The method of claim 7 wherein said implanting step includes implanting at an energy level in a range of between about 0.5 keV and 2 keV and a dose in a range of between about $1.0 \times 10^{14}$ cm$^{-2}$ to $1.0 \times 10^{15}$ cm$^{-2}$ to form a shallow implant, MDD device.

9. The method of claim 7 wherein said implanting step includes implanting to yield a surface ion concentration in said source and drain regions in a range of about $1.0 \times 10^{19}$ cm$^{-3}$ to $1.0 \times 10^{22}$ cm$^{-3}$ to form a shallow implant, MDD device.

10. The method of claim 6 wherein said step of depositing a silicide layer includes depositing a silicide layer by selective CVD of silicide only over the source region, drain region and gate electrode.

11. The method of claim 6 including, following said step of depositing a silicide layer, the steps of depositing an insulating layer over the structure and metallizing the structure.

* * * * *